United States Patent
Beinat

(10) Patent No.: US 10,233,534 B2
(45) Date of Patent: Mar. 19, 2019

(54) PROCESS FOR PHYSICAL VAPOR DEPOSITION OF A MATERIAL LAYER ON SURFACES OF A PLURALITY OF SUBSTRATES

(71) Applicant: ESSILOR INTERNATIONAL (COMPAGNIE GENERALE D'OPTIQUE), Charenton le Pont (FR)

(72) Inventor: Olivier Beinat, Charenton le Pont (FR)

(73) Assignee: ESSILOR INTERNATIONAL, Charenton le Pont (FR)

( * ) Notice: Subject to any disclaimer, the term of this patent is extended or adjusted under 35 U.S.C. 154(b) by 0 days.

(21) Appl. No.: 15/326,261

(22) PCT Filed: Jul. 10, 2015

(86) PCT No.: PCT/EP2015/065794
§ 371 (c)(1),
(2) Date: Jan. 13, 2017

(87) PCT Pub. No.: WO2016/008811
PCT Pub. Date: Jan. 21, 2016

(65) Prior Publication Data
US 2017/0204508 A1    Jul. 20, 2017

(30) Foreign Application Priority Data
Jul. 15, 2014 (EP) ..................................... 14306152

(51) Int. Cl.
| C23C 14/00 | (2006.01) |
| C23C 14/24 | (2006.01) |
| C23C 14/08 | (2006.01) |
| C23C 14/22 | (2006.01) |

(52) U.S. Cl.
CPC ............ C23C 14/243 (2013.01); C23C 14/08 (2013.01); C23C 14/221 (2013.01); C23C 14/24 (2013.01)

(58) Field of Classification Search
CPC ..... C23C 14/0036; C23C 14/30; C23C 14/08; C23C 14/3478
See application file for complete search history.

(56) References Cited

U.S. PATENT DOCUMENTS

| 6,171,462 B1 * | 1/2001 | Gries ...................... C23C 14/50 118/500 |
| 2003/0180462 A1 * | 9/2003 | Chang ..................... C23C 14/30 427/255.28 |
| 2005/0034529 A1 * | 2/2005 | Tang ........................ G01L 1/18 73/777 |
| 2013/0263784 A1 * | 10/2013 | Lee ......................... C03C 17/00 118/723 R |

FOREIGN PATENT DOCUMENTS

| CN | 103154298 | 6/2013 |
| JP | 61-5455 | * 1/1986 |
| JP | H03-138356 | 6/1991 |
| JP | H07316791 | * 12/1995 |

OTHER PUBLICATIONS

Martin-Tovar, E.A., et al., "Effect of substrate rotation speed on structure and properties of Al-doped ZnO thin films prepared by rf-sputtering." Transactions of Nonferrous Metals Society of China, 27(2017) 2055-2062.*
Pellicori, Samuel, "Materials & Deposition Technology for Coating Optical Surfaces". Materion Technical Paper, pp. 1-11. No citation information nor date available.*
Singh, Jogender, et al., "An Overview: Electron Beam-Physical Vapor Deposition Technology—Present and Future Applications". pp. 1-16. No Citation information nor date available.*
International Search Report for PCT/EP2015/065794, dated Dec. 10, 2015.

* cited by examiner

Primary Examiner — Bret P Chen
(74) Attorney, Agent, or Firm — Norton Rose Fulbright US LLP

(57) ABSTRACT

Disclosed is a process of physical vapor deposition of a material layer on surfaces of a plurality of substrates (11), wherein the plurality of substrates (11) are arranged on a dome (12) which rotates according to a dome rotation axis (300); the material to be deposited is vacuum evaporated thanks to an energy beam from a target (13); the energy beam interacts with a beam impact surface of the target chosen within the list consisting of a part of a main surface (15) and a part of an edge (14) of the target and wherein the material diffuses from the target to the substrates around a main diffusion axis (100) which intersects the dome (12) at an intersection point, I; and the angle α between the dome rotation axis (300) and the main diffusion axis (100) is chosen within the ranges of +5° to +40° or −5° to −40°.

9 Claims, 7 Drawing Sheets

PROCESS FOR PHYSICAL VAPOR DEPOSITION OF A MATERIAL LAYER ON SURFACES OF A PLURALITY OF SUBSTRATES

CROSS-REFERENCE TO RELATED APPLICATIONS

This application is a national phase application under 35 U.S.C. § 371 of International Application No. PCT/EP2015/065794 filed 10 Jul. 2015, which claims priority to European Patent Application No. 14306152.1 filed 15 Jul. 2014. The entire contents of each of the above-referenced disclosures is specifically incorporated by reference herein without disclaimer.

The invention relates to the field of physical vapor deposition. More specifically, it relates to a process for energy beam physical vapor deposition of a material layer on surfaces of a plurality of substrates, for example ophthalmic spectacle lenses. According to an example, the thickness of the material layer is comprised between 10 nm and 500 nm.

The present invention also relates to a physical vapor deposition device.

Layer deposition is a process applied in many industries to form coating so as to protect surfaces and/or to impart a variety of desired properties to said surfaces.

For example, in optics, an antireflective or anti-reflection (AR) layer is a type of optical layer applied to the surface of lenses or other optical devices to reduce reflection.

Physical Vapor Deposition is a well-known process performed under vacuum in which a target consisting of a material is bombarded with an energy beam. The energy beam causes atoms from the target to transform into the gaseous phase. These atoms then precipitate into solid form, coating simultaneously the plurality of substrates in a vacuum chamber with a layer of the material. In optics, a plurality of substrates is generally held by a substrate holder which is a dome rotating around a vertical axis. The dome is, for example, curved and corresponds for example to a portion of a sphere. For example, the radius of curvature of said sphere is comprised between 50 cm and 2 m.

The inventors have established that devices for depositing material layers on surfaces of a plurality of substrates face some difficulties to get uniformity of thickness distribution of the layers on substrates all over the dome.

As an example, the inventors have established that thickness homogeneity, between interior substrates and exterior substrates, may not be easily obtained for "thick" antireflective layers, in particular for ZrO2 layers.

In the frame of the present invention, a "thick" layer has a thickness equal or greater to 50 nm, or at least greater than 70 nm.

The inventors have established that in usual situations, there is a lack of material remaining on lenses located on the periphery of the dome as compared to the thickness of material present on the lenses located near the center of the dome.

A problem that the invention aims to solve is to offer a process for depositing a material layer on surfaces of a plurality of substrates wherein the thickness of the layer deposited on substrates is uniform over all the substrates held by the dome (i.e.: both for substrates located close to the periphery of the dome and for substrates located close to the center of the dome).

For this purpose, an object of the invention is a process of physical vapor deposition of a material layer on surfaces of a plurality of substrates, wherein:

the plurality of substrates are arranged on a dome which rotates according to a dome rotation axis and where the substrates are placed at least two different distances (IN,EX) from the dome rotation axis;

the material to be deposited is vacuum evaporated thanks to an energy beam from a target which is made of said material and has a first main surface and an edge located around said main surface;

the energy beam interacts with a beam impact surface of the target chosen within the list consisting of a part of the main surface and a part of the edge of the target and wherein the material diffuses from the target to the substrates around a main diffusion axis which intersects the dome at an intersection point, I; and the angle α between the dome rotation axis and the main diffusion axis is chosen within the ranges of +5° to +40° or −5° to −40°.

In the context of the invention, any kind of energy beam suitable for vacuum evaporating materials can be used. For example, it can be an electron beam, an ion beam or a laser beam.

According to a particular embodiment, the energy beam is an electron beam and can be targeted to the target by means of a magnetic field which deviates appropriately the electron beam.

According to an embodiment, the substrates are ophthalmic spectacle lenses.

For example, the substrates are made of a material chosen in the group consisting of inorganic and organic material.

In particular the substrates can be any substrate commonly used in the field of optics and in particular in the ophthalmic field. Those are, for example, composed of a thermoplastic or thermosetting plastic.

Mention may be made, by way of examples, of substrates made of polycarbonate, of polyamide, of polyimide, of polysulfone, of copolymers of poly(ethylene terephthalate) and polycarbonate, of polyolefins, in particular of polynorbornene, of homopolymers and copolymers of diethylene glycol bis(allyl carbonate), of (meth)acrylic polymers and copolymers, in particular (meth)acrylic polymers and copolymers derived from bisphenol A, of thio(meth)acrylic polymers and copolymers, of polyurethane and polythiourethane homopolymers or copolymers, epoxy polymers and copolymers and episulfide polymers and copolymers.

For example, it will be possible to use a diethylene glycol bis(allyl carbonate), such as CR39®, in particular with a refractive index of 1.5, sold by PPG Industries, or else a polythiourethane, such as MR7®, in particular with a refractive index of 1.66, sold by Mitsui Toatsu, polycarbonate materials.

For example, the layer(s) is (are) deposited on concave and/or convex side of the plurality of substrates.

According to an embodiment of the invention, the main diffusion axis (100) is defined as the axis perpendicular to the tangent plane of the beam impact surface and intersecting the dome rotation axis.

The tangent plane is calculated differently according to the shape of the beam impact surface When the beam impact surface of the target is plane, the tangent plane is calculated at any point of the beam impact surface.

When the beam impact surface of the target is not plane, two cases can be envisaged:
if there is only one impact of the beam on the surface, the tangent plane of the beam impact surface is the tangent plane corresponding to the impact of the beam, it there is a plurality of impacts of the beam on the surface, the tangent plane of the beam impact surface is either the average of the tangent plane corresponding to each impact of the beam or the tangent plane of the beam impact surface is the tangent plane of the barycenter corresponding to the plurality of impacts of the beam.

According to an embodiment of the invention, a positive α angle is situated on a side of the dome rotation axis where the target is and a negative one is directed toward the other side of said dome rotation axis, with the main diffusion axis going from the target toward the dome axis. According to a different embodiment, a negative α angle is situated closer to the energy beam source than a positive α angle.

According to an embodiment of the invention, the dome has a circular peripheral contour which is centered at the dome rotation axis and is a peripheral contour radius, PCR, apart from the dome rotation axis, and wherein the intersection point, I is situated at a distance from the dome rotation axis which is comprised between 0.20×PCR and 0.90×PCR. According to further embodiments, the intersection point, I, is situated at a distance from the dome rotation axis which is comprised between 0.30×PCR and 0.85×PCR, as for example between 0.35×PCR and 0.80×PCR.

According to an embodiment of the invention, the dome has a circular peripheral contour which is centered at the dome rotation axis and has a peripheral contour radius, PCR, comprised between 0.50 m and 1.20 m.

In the frame of the present invention IN ("internal") substrates means substrates located closest to the rotation center of the dome and EX ("external") substrates means substrates located farthest to the rotation center of the dome.

For example, the angle α between the dome rotation axis and the main diffusion axis is chosen within the ranges of +10° to +30° or −10° to −30°.

According to another embodiment, the angle α between the dome rotation axis and the main diffusion axis is chosen within the ranges of +15° to +25° or −15° to −25°.

According to an embodiment, the substrates (IN) are placed at a distance from the dome rotation axis comprised between 5 cm and 25 cm, for example between 10 cm and 15 cm perpendicular to the dome rotation axis and the substrates (EX) are placed at a distance from the dome rotation axis comprised between 30 cm and 110 cm, for example between 50 cm and 100 cm perpendicular to the dome rotation axis, with the proviso that the substrates are placed at at least two different distances (IN,EX) from the dome rotation axis. Those distance values are measured taking into account the position of the barycenter of each individual substrate. The values, and in particular the distance of the EX substrates may depend on the specific vacuum deposition machine.

According to an embodiment of the invention, the angle a between the dome rotation axis and the main diffusion axis can be provided thanks to different ways.

According to an embodiment of the invention, the target is situated close to the dome rotation axis; according to further embodiments, the target is situated at a distance from the dome rotation axis equal or less to 5 cm, for example equal or less to 2 cm. According to an embodiment of the invention, the center of the target is situated on the dome rotation axis.

Angle α Obtained by Impacting a Flat Surface of the Target

According to an embodiment, the first main surface of the target is a main surface which faces the substrates and the process comprises a preliminary step consisting in orientating said main surface so that the angle between the dome rotation axis (300) and the main diffusion axis (100) is imposed with a value within the ranges of +5° to +40° or −5° to −40°.

According to an embodiment of the invention, the target is arranged and fixed in a holder, called thereafter liner, and the step of orientating the main surface of the target is obtained by tilting the liner.

According to an embodiment, a plurality of liners can be gathered in a plurality of pockets of a crucible.

According to an embodiment of the invention, the target is tilted of an angle a with regard to a plane perpendicular to the dome rotation axis.

Inside each given machine, an optimal tilting angle a depends on different parameters such as the nature of the material to be deposited and/or the thickness of the layer to be deposited.

A person skilled in the art can easily determine, based on the invention, the optimal α range within the a range of the present invention so as to optimize the process according to the invention. The optimal α range may vary when using different physical vapor deposition devices. It may also vary as a function of the material to be deposited.

Thus, the surface of the target facing the substrates is inclined according to an optimal angle for a predetermined layer to be deposited (nature of the material, thickness).

The optimal angle α for thickness layer of a given material can be determined thanks to a previous calibration experiment or can be obtained from a data base.

As an example, it has been shown that the optimal angle a for depositing a layer of ZrO2 on a plurality of substrates is between 21 ° and 31 ° when using a machine comprising a vacuum chamber commercialized by Leybold Company under the reference LH1104 . As another example, it has been shown that the optimal angle α for depositing a layer of ZrO2 on a plurality of substrates is between 14° and 22° when using a machine comprising a vacuum chamber commercialized by Satisloh Company under the reference L1200.

The invention can be applied to the target of different shapes such as one having a truncated shape or one having a cylinder shape, namely a circular cylinder shape, or other shapes.

According to another embodiment of the invention, the step of orientating the first main surface of the target is obtained by providing a target having a second main plane surface, the angle between the said surfaces being chosen within the ranges of +5° to +40° or −5° to −40°. In that embodiment the target is positioned on the liner or on the crucible at least by contact of the second main surface, and the liner's orientation, or lack thereof, combines with the angle between the first main surface and the second main surface to provide the angle of the invention. Thus, in this embodiment, the liner may not need to be tilted because the target main surface can easily be orientated according to the optimum angle a even on a liner which is horizontal. This method enables one to install easily the targets.

Angle α Obtained by Impacting an Edge of the Target

According to another an embodiment, the edge of the target has a cylindrical shape and faces the substrates and the process comprises a preliminary step consisting in tuning the energy beam so as said energy beam impacts only the edge of the target.

The embodiments below may be applied to one or both of the embodiments cited above, in combination or isolated.

According to different embodiments of the invention, the target is chosen in the group consisting of a pellet, powders, and granulates.

When the target is in a form of powders or granulates, said powders or granulates are usually crushed and/or compacted for example with a flat end pestle so as to form a flat surface which can be inclined or not.

Different kind of materials can be used according to the invention depending on the desired properties (for example antireflection, antistatic, antiabrasion properties).

According to an embodiment, the material to be deposited is chosen in the group consisting of $ZrO_2$, $SiO_2$, $MgF_2$, MgO, indium tin oxide, also called ITO, $SnO_2$, $TiO_2$ and $Ta_2O_5$.

The process according to the invention enables to deposit a plurality of material layers on a plurality of substrates.

Usually, the plurality of layers consists of layers of different thicknesses and made of different materials. The plurality of layers may comprise a plurality of layers of the same material.

According to an embodiment, the present invention relates to a process for depositing a plurality of material layers on a plurality of substrates wherein at least two targets of the same material are used to implement the steps of the process of the invention and where the main diffusion axes provided by said targets are orientated according to two different α angles.

For example, the process of the invention enables to deposit the following successive layers:
- a fist layer of ZrO2 having a thickness comprised between 18 and 23 nm/a first layer of SiO2 having a thickness comprised between 18 and 23 nm/a second layer of ZrO2 having a thickness comprised between 98 nm and 108 nm/a second layer of SiO2 having a thickness comprised between 75 and 85 nm, said successive layers being deposited on concave side of the substrates with the fist layer of ZrO2 facing the concave side of the substrates, and
- a fist layer of ZrO2 having a thickness comprised between 25 and 35 nm/a first layer of SiO2 having a thickness comprised between 18 and 23 nm/a second layer of ZrO2 having a thickness comprised between 75 nm and 85 nm/a second layer of SiO2 having a thickness comprised between 75 and 85 nm, said successive layers being deposited on convex side of the substrates with the fist layer of ZrO2 facing the convex side of the substrates.

The invention may be applied to any other vacuum deposition process, comprising more or less layers than in the specific example above, in a similar or different arrangement, with possibly different materials.

Another object of the present invention is an electron beam physical vapor deposition device comprising
- a dome arranged to rotate according to a dome rotation axis and designed for holding a plurality of substrates placed at at least two different distances from the dome rotation axis;
- an energy beam generating device suitable for vacuum evaporating material and configured to impact a surface of a target with an energy beam so as the material diffuses from the target to the substrates around a main diffusion axis, and
- a tilting device suitable for tilting a target so as a target plane surface facing the dome can be arranged with an angle between said surface and the rotation axis comprised between 50° to 85°,
- whereas the dome, the energy beam and the tilting device are configured so that main the diffusion axis intersects the dome at an intersection point, I.

According to an embodiment of the invention, the target is arranged and fixed in a tiltable liner.

According to another embodiment of the invention, the tiltable liner has a circular cylindrical shape longitudinally cut by a plane and is arranged in a rectangular parallelepipedical pocket of a crucible said pocket having a bottom and walls; the liner contacts two parallel pocket walls along two parallel lines that are parallel to the cylinder axis of said liner.

The features of the present invention, as well as the invention itself, both as to its structure and its operation, will be best understood from the accompanying non limiting drawings and examples, taken in conjunction with the accompanying description, in which.

Elements in the figures are illustrated for simplicity and clarity and have not necessarily been drawn to scale. For example, the dimensions of some of the elements in the figure may be exaggerated relative to other elements to help improve the understanding of the embodiments of the present invention. Same part numbering is used to designate the same parts in the different figures.

Figure 1A:
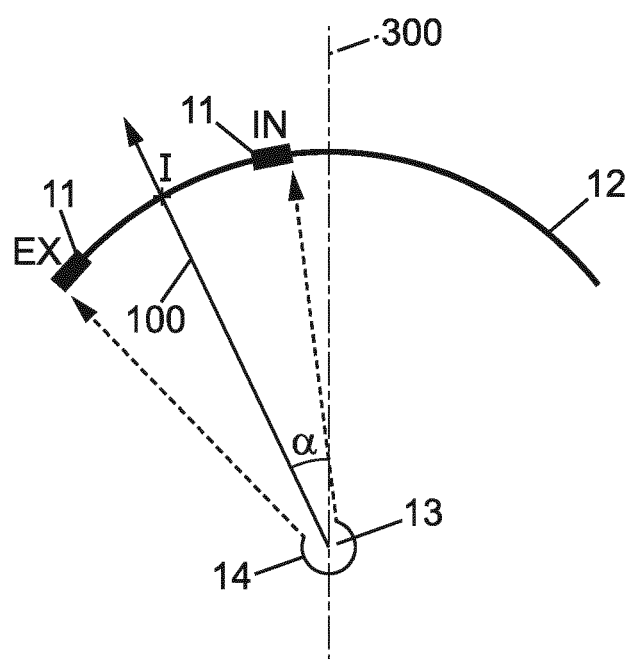
FIG. 1a is a scheme representing the main diffusion axis of a material formed from a pellet positioned on its edge when it is impacted by an electron beam (e-beam) on its edge according to an embodiment of the invention.
Figure 1B:
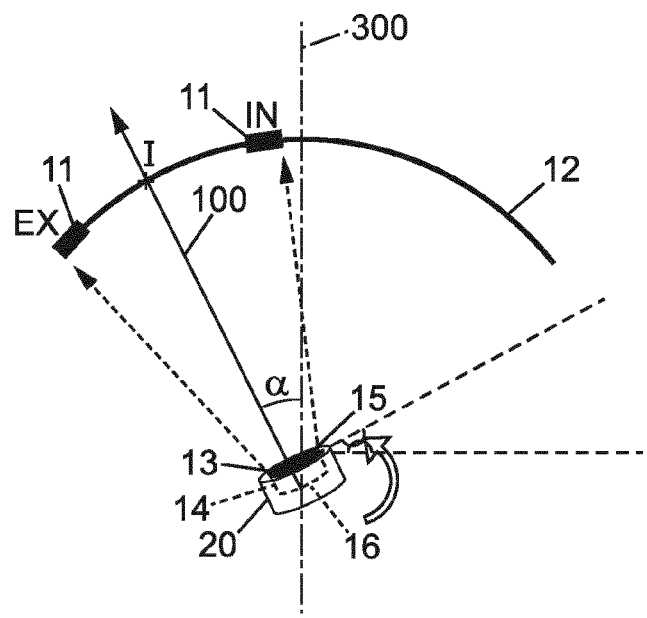
FIG. 1b is a scheme representing the main diffusion axis of a material formed from a tilted pellet when it is impacted by an e-beam on its flat surface according to an embodiment of the invention.

FIGS. 1a and 1b describe two different embodiments of the invention.

In FIGS. 1a and 1b, the target 13 has a circular cylinder shape.

In FIG. 1a, the target 13 has two plane parallel surfaces 15 and 16 and an edge 14. The target 13 is positioned on its edge 14 so as the edge faces the substrates and the electron beam (not represented in the figure) impacts the edge of the target.

In FIG. 1b, the target is positioned on its second main surface 16 so as the first main surface 15 faces the substrates and the electron beam (not represented in the figure) impacts the flat surface 3 of the target which is tilted of an angle α regarding a plane perpendicular to the dome rotation axis.

In both of these figures are represented a plurality of substrates 11 arranged on a dome 12 which rotates according to a dome rotation axis 300 and where the substrates are placed at at least two different distances (IN,EX) from the dome rotation axis.

In both of these figures, the main diffusion axis 100 intersects the dome 12 at an intersection point, I. The dome 12 has a circular peripheral contour which is centered at the dome rotation axis and is a peripheral contour radius, PCR, apart from the dome rotation axis. The intersection point, I, is situated at a distance from the dome rotation axis which is comprised between 0.40×PCR and 0.60×PCR.

According to an embodiment, a plurality of substrates is placed at the same distance IN and at the same distance EX. Other substrates may be placed between IN and EX.

The energy beam interacts with a beam impact surface of the target chosen within the list consisting of a part of the main surface (15) (FIG. 1b) and a part of the edge (14) (FIG. 1a) of the target and the material diffuses from the target (13) to the substrates (11) around a main diffusion axis (100).

The target 13 is arranged within a liner 20.

EXAMPLES

For the following examples, the process of the invention makes reference to the following antireflective coating deposited on a lens:
a) on the concave side of the substrate:
  a first layer of ZrO2 having a thickness comprised between 18 and 23 nm, called Z1CC,
  a first layer of SiO2 having a thickness comprised between 18 and 23 nm, called S1CC,
  a second layer of ZrO2 having a thickness comprised between 98 nm and 108 nm, called Z2CC,
  a second layer of SiO2 having a thickness comprised between 75 and 85 nm, called S2CC.
  The successive layers being deposited on concave side such that the fist layer of ZrO2 faces the concave side of the substrates, and
b) on the convex side of the substrate:
  a fist layer of ZrO2 having a thickness comprised between 25 and 35 nm, called Z1CX,
  a first layer of SiO2 having a thickness comprised between 18 and 23 nm, called S1CX,
  a second layer of ZrO2 having a thickness comprised between 75 nm and 85 nm, called Z2CX,
  a second layer of SiO2 having a thickness comprised between 75 and 85 nm, called S2CX,
  The successive layers being deposited on concave side such that the fist layer of ZrO2 faces the concave side of the substrates.

In each example, the exemplified layer is a single layer (it means that the exemplified layer in each example is in contact with the substrate without the presence of others layers, unless the contrary is mentioned) but will be designated as the layer of same thickness, and of the same material according to the antireflective stacking described above.

Part A: Angle α Provided by Impacting an Edge of the Target by an Electron Beam

Example 1

Deposition of ZrO2 Optical Layers on Convex and Concave Sides of a Plurality of Ophthalmic Spectacle Lenses A ZrO2 optical layer was deposited on the convex side of the plurality of ophthalmic spectacle lenses (IN, EX).
One will designate EX lenses, lenses which are situated at EX distance perpendicular to the dome rotation axis.
One will designate IN lenses, lenses which are situated at IN distance perpendicular to the dome rotation axis.

In this example, the deposited layer has the same thickness as the Z2CX layer (about 80 nm).

Z2CX layer is deposited according to the process of the invention, by evaporating the material of the pellet on its edge so as to provide an angle α of about 35°.

Figure 2:
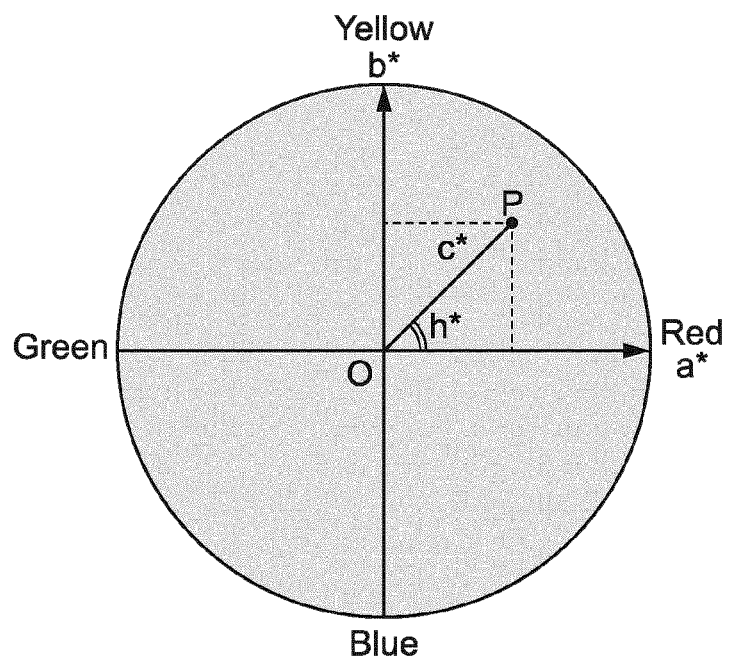
FIG. 2 is a schematic black and white representation of the colorimetric system a*b*.

FIG. 2 is a schematic black and white representation of the colorimetric system a*b* and will be helpful for the interpretation of the chroma maps.

In this figure, an x axis called "a*" is plotted in a plane from point O, and serves to measure the variation from red to green. A y axis called "b*" measures the variation from yellow to blue. A color is defined by a point P from coordinates "a*, b*", hue "h*" is the angle formed by OP with the a* axis, and saturation "C*" is equal to the length of segment OP.
  hue "h*" translates the sensation of color into a quantitative value: the hue angle, measured from the red part of the a* segment, an hue angle of 0 degree identifying a red colour,
  saturation "C*", or Chroma, expresses the sensation of chromatic purity, i.e. the position on a scale going from "achromatic" black/white, devoid of any tonality, to "monochromatic" saturated color, of completely pure tonality.

Figure 3:
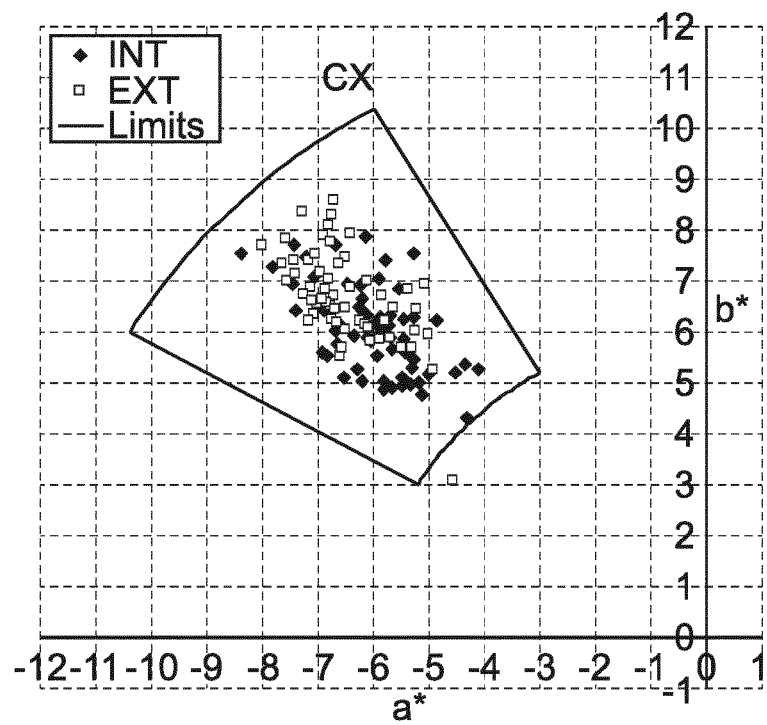
FIG. 3 is a chroma map for a 80 nm layer of ZrO2 deposited on the convex side of the lenses.

FIG. 3 shows a chroma map of the convex surfaces of the substrates arranged on the external and on the internal sides of the dome.
In this figure, solid lines represent the limits defined by the inventors to draw an area where results are satisfactory. The light points (square points) and the dark points (diamond points) are respectively the chroma values measured for EX lenses and IN lenses.

FIG. 3 clearly shows that chromaticity is very similar for substrates placed on the external and internal sides of the dome. Accordingly, all the substrates arranged on the dome have very similar chromaticity which means that the thickness of the layers is very similar for all the substrates.

This example shows that when the pellet is evaporated on its edge, the process according to the invention gives satisfactory results in terms of thickness homogeneity.

Part B: Angle α Provided by Tilting the Target

Example 2

Calibration Experiment: Determination of the Optimal Tilting Angle so as to Obtain a Uniform Thickness of ZrO2 Layers for the Plurality of Ophthalmic Spectacle Lenses (IN, EX)

Figure 4:
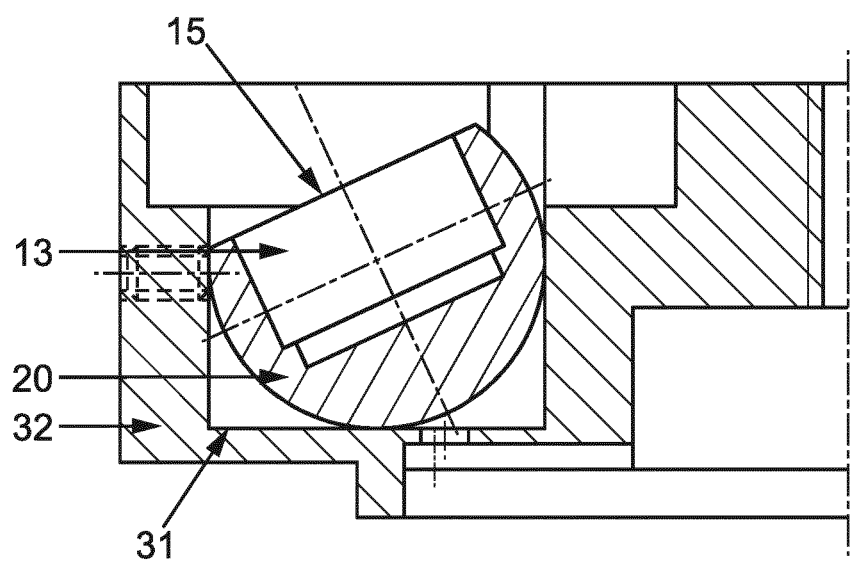
FIG. 4 represents a vertical cross section of a crucible comprising a tilted liner according to the invention.

Materials Used
  vacuum chamber LH1104 (from Leybold) equipped with ESV14 e-beam evaporator with 8-pocket crucible in which each pocket is configured to hold a material target in a liner a standard crucible has substantially the form of a disk comprising a plurality of holes, named "pockets", suitable for receiving targets; said targets may be arranged in a liner which surrounded the target but not the main target surface; standard pockets have a cylindrical shape and the axis of cylindrical shape is parallel to the rotating axis of the dome when the process is operating;

a full dome of lenses (lenses are placed all over the dome and notably close to the periphery of the dome: EX lenses and close to the center of the dome: IN lenses);

ZrO2 single layers were deposited on bare Orma (CR39 ®) lenses with a base of −2.00 and a diameter of 70 mm:

ZrO2 layer of 100 nm deposited on the concave side of the substrate (having the same thickness as Z2CC layer), and ZrO2 layer of 80 nm deposited on the convex side of the substrate (having the same thickness as Z2CX layer).

a standard crucible has been modified to allow introducing specific liners arranged for tilting the target. FIG. 4 shows a said specific liner 20 arranged in a pocket 31 of a crucible 32. The pocket 31 has a rectangular parallelepipedical shape and has a bottom and walls; the liner 20 has a circular cylindrical shape longitudinally cut by a plane; the liner 20 is arranged within the pocket 31; a target 13 is arranged in the liner 20; the diameter of the circular cylindrical shape is the equal to the width of the rectangular parallelepipedical shape as seen on the vertical cross section of FIG. 4. Accordingly, the liner 20 contacts two parallel pocket walls along two parallel lines that are parallel to the cylinder axis of said liner. Thanks to said arrangement, orientating the main surface 15 of the target 13 can be done precisely and easily.

Method Measurements

Measurements using reflective spectroscopy were performed using proprietary data management software, called "monolayer" to evaluate thickness.

The monolayer software is generally used in a mode that doesn't show the true value of the thickness but directly a "λ value" that can be later translated into an effective thickness for a given material. λ corresponds to a wavelength selected during the reflective measurement as being the wavelength for which the layer acts as a perfect quarter wave plate layer. Such relation between λ and the actual thickness may be non-linear.

Thus in the following invention, the thicknesses may be expressed in thickness value or in λ value, depending on the case. The values expressed represent physical thickness values unless the λ value is specifically mentioned.

The person skilled in the art knows multiple methods to evaluate the thickness of a layer with accuracy. As the invention is not focused on the exact thickness of a layer but on the identity of thicknesses between IN and EX substrates, the measurement method for the thickness has little impact on the reproducibility of the invention.

Internal (IN) lenses had their thickness measured at a point situated close to an edge of the lens situated at the closest of the dome rotation axis when the process is implemented and external (EX) lenses had their thickness measured close to an edge of the lens situated at the farthest of the dome rotation axis when the process is implemented in order to characterize the maximum difference.

A pellet of ZrO2 was disposed in the liner of a pocket so as to deposit a layer of 100 nm of ZrO2 (designated later on as Z2CC layer since having the same thickness as the Z2CC layer), on the concave side of the plurality of lenses (IN, EX).

During the whole experiment, the electron beam impacts the flat surface of the target disposed in the said pocket.

Figure 5:
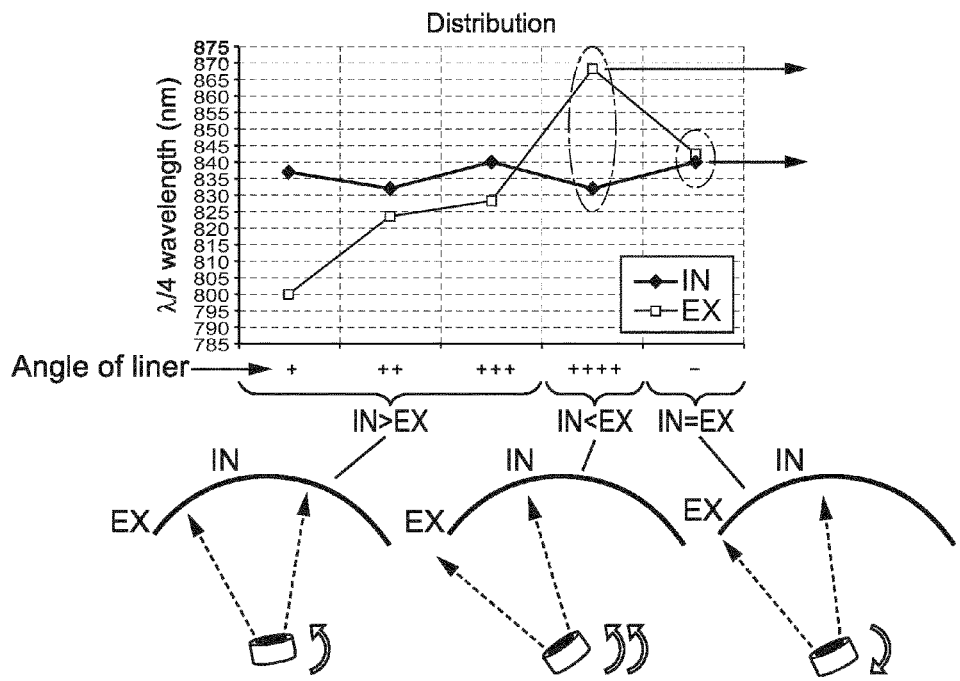
FIG. 5 represents the thickness distribution of a 100 nm ZrO2 layer deposited on concave side of lenses (IN,EX) according to the tilting angle.

As shown in FIG. 5, the optimal angle for a 100 nm thickness layer of ZrO2 was obtained by iterative approximations. The liner was tilted more and more after each run and thickness distribution was checked working directly with the λ values (effective thickness of about 100 nm corresponding to a λ value of about 800 nm).

At a given angle, distribution could be reversed giving then flexibility when setting up the process on the device.

In that case, the angle of the liner was adjusted manually through iterations without measuring specifically the angle before the adequate range angle has been identified.

Very good distribution was obtained on last run when the layer thickness deposited on EX lenses is equal to the layer thickness deposited of IN lenses.

Thus, it has been found that an angle of 23 degrees was best to deposit a 100 nm thick layer of ZrO2 (λ value of around 800 nm) on the concave side of a plurality of lenses (Z2CC layer).

A similar experiment was performed to deposit 80 nm of ZrO2 (λ value of around 600 nm) on the convex side of a plurality of lenses (Z2CX layer) and it has been found that an angle of 17 degrees was the optimal angle corresponding to the Z2CX layer (data not shown).

Example 3

Verification of the Reproducibility of the Process According to the Invention a) Z2CC: Layer of ZrO2 on the Concave Side of the Plurality of Lenses (INT, EXT)

The optimal angle for depositing a 100 nm thick layer of ZrO2 on the concave side of a plurality of substrates was determined according to the angle found in example 2 from the calibration experiment for the Z2CC layer.

Thus, in this example, the liner was tilted of an angle of 23° with regard to a plane perpendicular to the dome rotation axis.

The beam parameters (energy, impact point on flat surface of the target, beam frequency, trajectories of the impact point on the target, etc.) were the same as those used in the example 2.

Twelve Z2CC single layers were deposited on bare Orma (CR39®) material) with a base curvature of −2.00 as lens substrates on their convex side.

The substrates were placed all over the dome (i.e. at least on the periphery of the dome (EX) and near the center of the some (IN)).

Figure 6A:
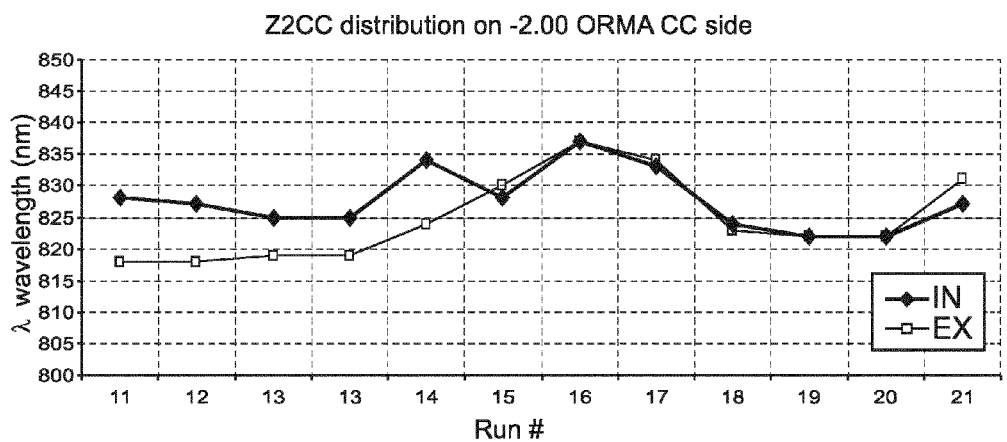
FIG. 6A represents the thickness distribution of a 100 nm ZrO2 layer deposited on concave side of lenses (IN,EX) according to different runs.

As it can be seen from FIG. 6A, low differences between the thickness of layers on IN lenses and EX lenses are observed over the different runs underlying a good stability of the thickness distribution.

Figure 6B:
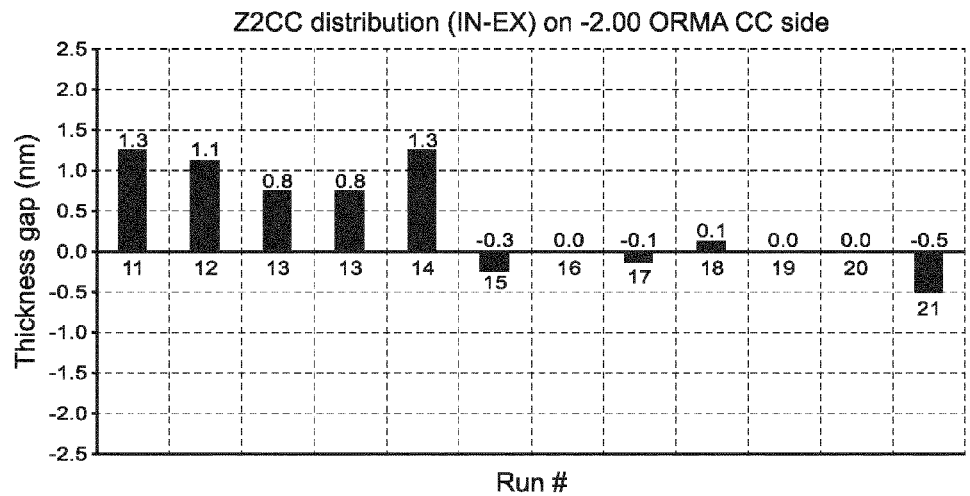
FIG. 6B represents the distribution gap of a 100 nm ZrO2 layer deposited on concave side between lenses (IN) and lenses (EX) according to different runs.

Moreover, FIG. 6B shows that the maximum difference in physical thickness (as opposed to λ value) is 1.3 nm, i.e. 1.23% of total thickness which is satisfactory.

Furthermore, it was measured, on un-displayed results, that the impact on the Chroma (C*) due to such gap between lenses IN/EX is 0.4 (a small Chroma gap corresponds to a small thickness gap between IN substrates and EX substrates).

b) Z2CX: Layer of ZrO2 on the Convex Side of the Plurality of Lenses (INT, EXT)

The optimal angle for depositing a 80 nm thick layer of ZrO2 was determined according to the optimal angle obtained for Z2CX in the example 2 from the calibration experiment.

Thus, in this experiment, the liner was tilted of an angle of 17° with regard to a plane perpendicular to the dome rotation axis.

The beam parameters were the same as those used in the example 2.

11 Z2CX single layers were deposited on bare Orma −2.00 as lens substrates on their convex side.

The substrates were spread at the periphery of the dome (EX) and near the center of the some (IN).

Figure 7A:
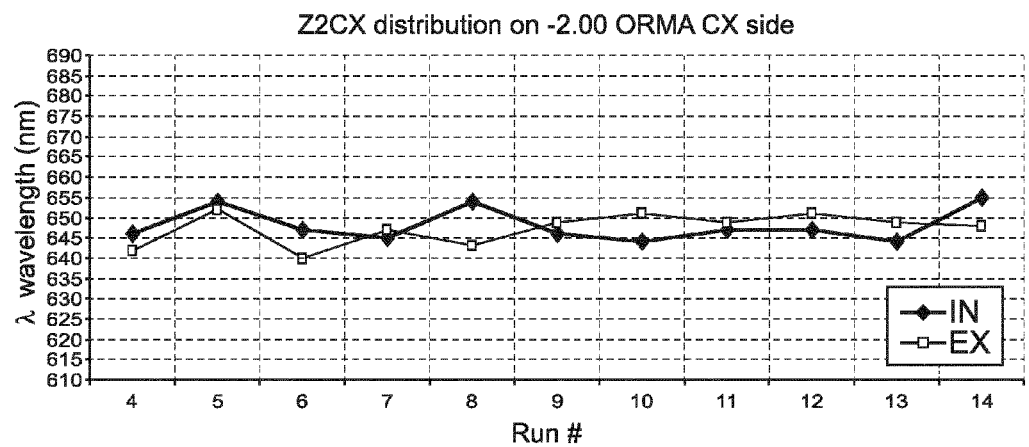
FIG. 7A represents the thickness distribution of a 80 nm ZrO2 layer deposited on convex side of lenses (IN,EX) according to different runs.

As it can be seen from FIG. 7A, low differences between the thickness of layers on IN lenses and EX lenses are observed over the different runs underlying a good stability of the thickness distribution.

Figure 7B:
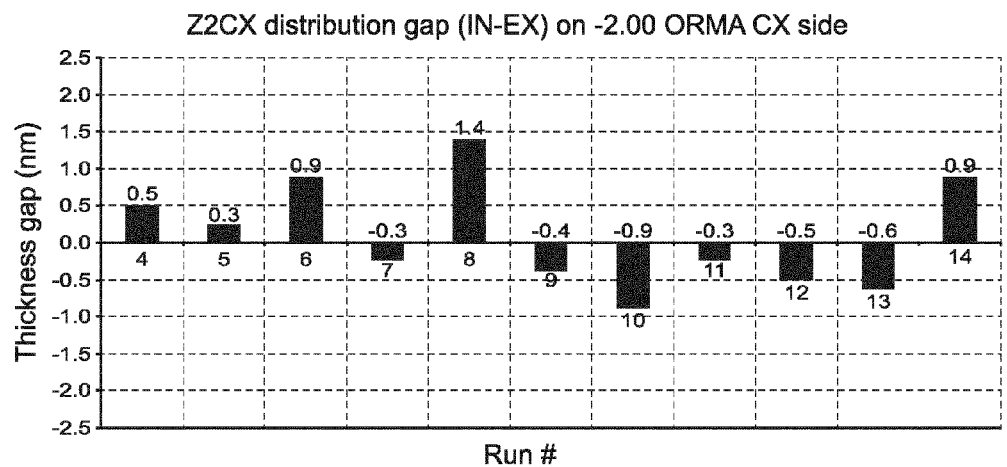
FIG. 7B represents the distribution gap of a 80 nm ZrO2 layer deposited on convex side between lenses (IN) and lenses (EX) according to different runs.

FIG. 7B shows that the maximum gap of physical thickness is 1.4 nm, 1.7% of total thickness.

Moreover, the impact on chroma C* due to such gap IN/EX is 0.5.

c) Z1CC: layer of ZrO2 on the concave side of the plurality of lenses (IN, EX)

A 20 nm layer of ZrO2 (Z1CC layer) is evaporated from a separate target of the crucible than the one used for Z2CC or Z1CX.

Z1CC quarter wave is too thin to be visible using the analysis tools which can manage a range 360-900 nm of $\lambda$ value. Indeed, with the thickness of Z1CC layer, the $\lambda$ value would be too far in the UV spectrum to be identified using the spectroscopes available during these experiments.

Thus, to be able to measure it, it was evaporated on top of previously deposited Z2CX (reproducibility test a) above). Distribution was then deducted by subtracting the previously measured Z2CX thickness.

The chosen way to be able to evaluate the thickness of Z1+Z2 was to evaporate Z1CC+Z2CX thicknesses on convex side of the lenses.

12 Z1CC single layers were deposited on bare Orma (CR39® material) with a base curvature of −2.00 as lens substrates on their convex side.

The substrates were placed all over the dome (i.e at the periphery of the dome (EX) and near the center of the some (IN)).

A similar calibration experiment as in example 2 was performed to deposit 20 nm of ZrO2($\lambda$ value of 145 nm) [corresponding to the thickness of a Z1CC layer] and it has been found that an angle of 17 degrees was the optimal angle to obtain uniform thickness layer between IN lenses and EX lenses.

A pellet of ZrO2 was disposed in the liner of the crucible and the liner was tilted of an angle of 17 degrees.

The electron beam impacts the flat surface of the target.

Figure 8A:
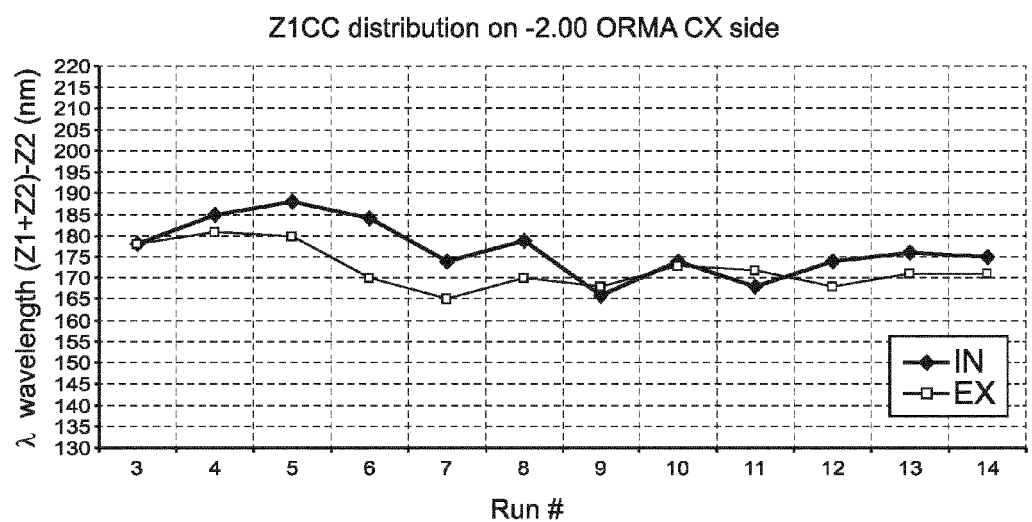
FIG. 8A represents the thickness distribution of a 20 nm ZrO2 layer deposited on convex side of lenses (IN,EX) according to different runs.

As it can be seen from FIGS. 8A, low differences between the thickness of layers on IN lenses and EX lenses are observed over the different runs underlying a good stability of the thickness distribution.

Wavelength $\lambda$ of quarter wave layer Z1 is deducted: $\lambda(Z2+Z1)-\lambda Z2$.

Figure 8B:
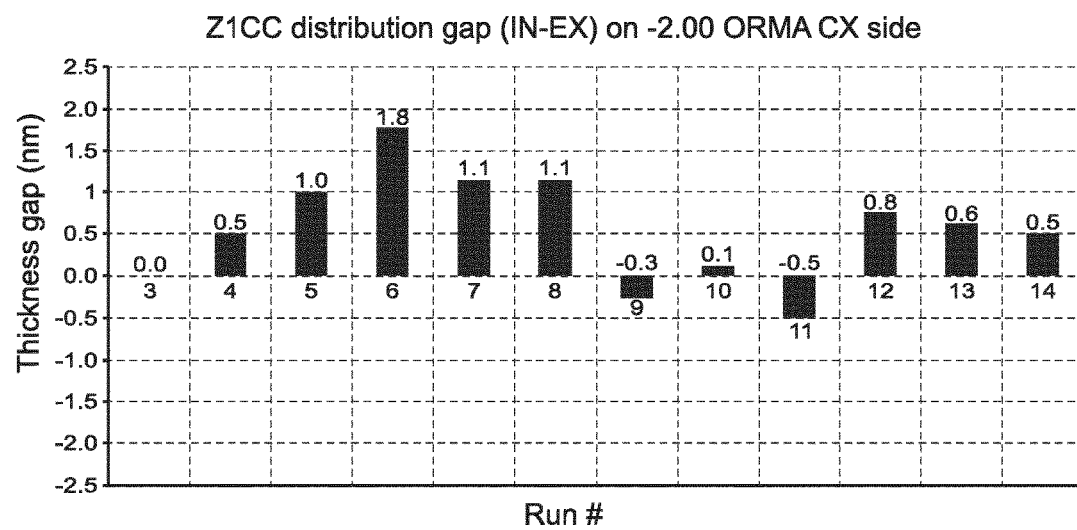
FIG. 8B represents the distribution gap of a 20 nm ZrO2 layer deposited on convex side between lenses (IN) and lenses (EX) according to different runs.

Maximum gap of physical thickness is 1.8 nm, 9.2% for CC and 6.2% for CX of total thickness (see FIG. 8B).

According to internal abascus, impact on chroma C* for such gap IN/EX is 0.3 for CC and 0.4 for CX that are very acceptable.

Example 4

Impact of Beam Shift on Distribution of Z2CX

The aim of this experiment was to check distribution gaps shifts in case the e-beam is drifting off course following X-axis. This phenomenon happens sometimes and was thus simulated: X position was increased and decreased from original position to see the impact on thickness layer distribution on IN and EX lenses.

Figure 9:
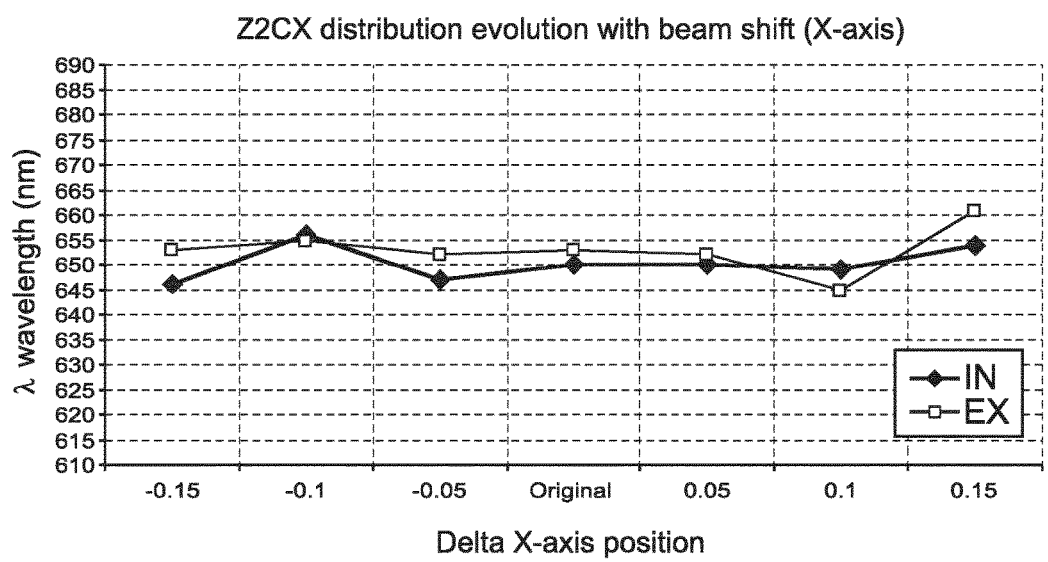
FIG. 9 represents the thickness distribution of a 80 nm ZrO2 layer deposited on convex side of lenses (IN,EX) according to the beam shift (X-axis).

As shown in FIG. 9, maximum physical thickness gap is 0.9 nm between IN and EX (1.1% of layer thickness) which is satisfactory.

The invention claimed is:

1. A process of physical vapor deposition of a material layer on surfaces of a plurality of substrates, wherein:
   the plurality of substrates are arranged on a dome which rotates according to a dome rotation axis and where the substrates are placed at least two different distances (IN,EX) from the dome rotation axis;
   the material to be deposited is vacuum evaporated thanks to an energy beam from a target which is made of said material and has a first main surface and an edge located around said main surface;
   the energy beam interacts with a beam impact surface of the target chosen within the list consisting of a part of the main surface and a part of the edge of the target and wherein the material diffuses from the target to the substrates around a main diffusion axis which intersects the dome at an intersection point, I; and
   the angle $\alpha$ between the dome rotation axis and the main diffusion axis is chosen within the ranges of +5° to +40° or −5° to −40°,
   wherein the first main surface of the target is a main surface which faces the substrates and wherein the process comprises a preliminary step consisting of providing an orientated main surface so that said main surface is orientated with said angle $\alpha$ being chosen within said ranges, and
   wherein the target is arranged and fixed in a tiltable liner and wherein the preliminary step of providing said orientated main surface of the target may be obtained by tilting the liner.

2. The process according to claim 1, wherein the main diffusion axis is the axis perpendicular to the tangent plane of the beam impact surface and intersecting the dome rotation axis.

3. The process according to claim 1, wherein the edge of the target has a cylindrical shape and faces the substrates and wherein the process comprises a preliminary step consisting in tuning the energy beam so as said energy beam impacts only the edge of the target.

4. The process according to claim 1, wherein the dome has a circular peripheral contour which is centered at the dome rotation axis and is a peripheral contour radius, PCR, apart from the dome rotation axis, and wherein the intersection point, I, is situated at a distance from the dome rotation axis which is comprised between 0.20×PCR and 0.90×PCR.

5. The process according to claim 4, wherein the intersection point, I, is situated at a distance from the dome rotation axis which is comprised between 0.30×PCR and 0.85×PCR, as for example between 0.35×PCR and 0.80×PCR.

6. The process according to claim 1, wherein the dome has a circular peripheral contour which is centered at the dome rotation axis and has a peripheral contour radius, PCR, comprised between 0.50 m and 1.20 m.

7. The process according to claim 1, wherein the substrates are ophthalmic spectacle lenses.

8. The process according to claim 1, wherein the material to be deposited is selected from the group consisting of $ZrO_2$, $SiO_2$, $MgF_2$, MgO, indium tin oxide, $SnO_2$, $TiO_2$ and $Ta_2O_5$.

9. A process for depositing a plurality of material layers on a plurality of substrates wherein at least two targets of the same material are used to implement the steps of the process according to claim 1 and where the main diffusion axes provided by said targets are orientated according to two different $\alpha$ angles.

* * * * *